United States Patent [19]

Tohma et al.

[11] Patent Number: 5,087,476
[45] Date of Patent: Feb. 11, 1992

[54] METHOD OF PRODUCING THIN FILM

[75] Inventors: Kiyokazu Tohma; Ryuji Sugita, both of Hirakata; Kazuyoshi Honda, Takatsuki; Yasuhiro Kawawake, Suita; Tatsuaki Ishida, Sakai, all of Japan

[73] Assignee: Matsushita Electric Industrial Co., Ltd., Osaka, Japan

[21] Appl. No.: 487,273

[22] Filed: Mar. 2, 1990

[30] Foreign Application Priority Data

Mar. 17, 1989 [JP] Japan ............... 01-067062
Jun. 19, 1989 [JP] Japan ............... 01-156522

[51] Int. Cl.⁵ .................... B05D 3/06; B05D 5/12; C23C 16/00
[52] U.S. Cl. .................... 427/35; 427/38; 427/129; 427/130; 427/251
[58] Field of Search .......... 427/35, 38, 42, 129, 427/130, 251

[56] References Cited

U.S. PATENT DOCUMENTS

| | | | |
|---|---|---|---|
| 4,393,091 | 7/1983 | Shinohara et al. | 427/35 |
| 4,489,124 | 12/1984 | Watanabe | 427/130 |
| 4,557,944 | 12/1985 | Arai et al. | 427/130 |
| 4,740,385 | 4/1988 | Feuerstein et al. | 427/38 |
| 4,776,925 | 10/1988 | Fossum et al. | 427/38 |
| 4,847,109 | 7/1989 | Shibasaki et al. | 427/130 |
| 4,886,681 | 12/1989 | Clabes et al. | 427/35 |
| 4,913,933 | 4/1990 | Kasanuki et al. | 427/130 |

Primary Examiner—Shrive Beck
Assistant Examiner—Marianne L. Padgett
Attorney, Agent, or Firm—Stevens, Davis, Miller & Mosher

[57] ABSTRACT

The method includes applying ions and electrons from an ion gun onto a polymer film while the polymer film is traveling circumferentially along a peripheral surface of a cylindrical can from a supply location to a take-up location of the polymer film relative to the cylindrical drum. The ions and electrons from the ion gun are applied onto a part of the polymer film while it is moving through a position near the supply location of the polymer film relative to the drum at which the polymer film begins to contact the outer peripheral surface of the drum. At a downstream location relative to the drum, electrons are applied from an electron gun onto the polymer film traveling on the drum surface. At a further downstream location relative to the drum, the thin film is deposited, e.g., by vacuum evaporation, on the polymer film travelling on the drum. This method enables a thin film, having no wrinkles and with a high adhesion strength with respect to the polymer film, to be produced in a stable manner.

13 Claims, 5 Drawing Sheets

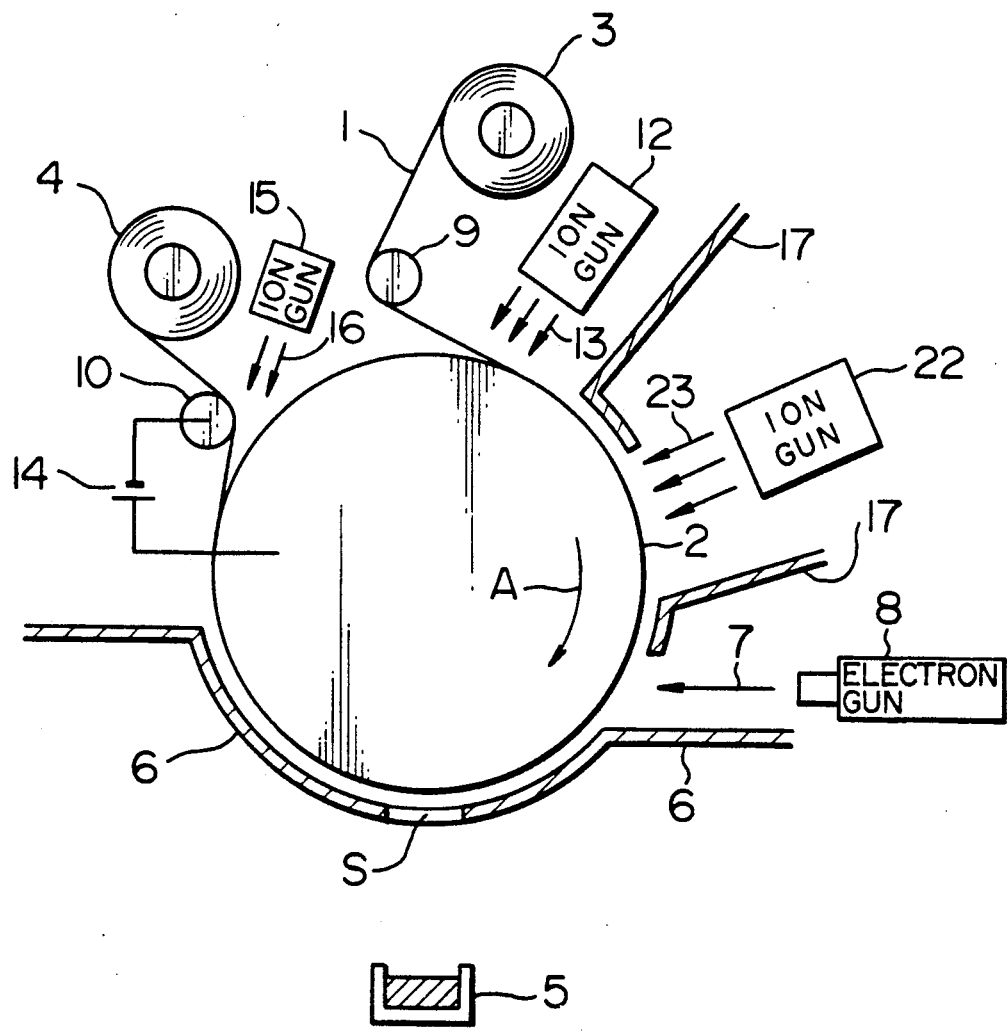
F I G. 4

METHOD OF PRODUCING THIN FILM

BACKGROUND OF THE INVENTION

Field of the Invention

This invention relates to a method of continuously forming or depositing a thin film on a polymeric film, i.e. forming a polymer film, by vacuum deposition, i.e. via vacuum evaporation.

A typical conventional method of forming a thin metal film on a polymeric film at a high productivity rate is a vacuum deposition method. FIG. 5 schematically shows an internal structure of such a vacuum deposition apparatus commonly used for the production of a thin film. A polymeric film 1 is transported around a cylindrical can 2 or travels circumferentially on the outer peripheral surface of the cylindrical can 2 in a direction indicated by arrow A. A thin film is deposited on the polymeric film 1 from an evaporation source 5. Reference numerals 3 and 4 denote a supply roll of the polymeric film 1 and its take-up roll, respectively. Reference numerals 9 and 10 denote free rollers. As the evaporation source 5, for example, a resistance-heating evaporation source, an induction-heating evaporation source or an electron beam evaporation source can be used. A shield plate 6 is provided between the evaporation source 5 and the cylindrical can 2 so as to prevent the vapor from the evaporation source 5 from depositing on unnecessary portions. The shield plate 6 has an opening S for allowing vapor to pass therethrough to be deposited on the polymeric film 1. When a thin film is to be produced by vacuum deposition at a high deposition rate, the polymeric film is susceptible to thermal deformation and thermal decomposition due to radiation heat from the evaporation source and condensation heat of the evaporated atoms. Therefore, in order to avoid such thermal damages during the formation of the thin film at a high deposition rate, it is necessary that the polymeric film 1 be disposed in intimate contact with the outer peripheral surface of the cylindrical can 2 so as to efficiently transfer the heat, received by the polymeric film 1, to the body of the cylindrical can 2. One method of keeping the polymeric film 1 in intimate contact with the outer periphery of the cylindrical can 2 is to apply an electron beam 7 from an electron gun 8 to the polymeric film 1 disposed in contact with the outer periphery of the cylindrical can 2, so that electrons penetrate into the polymeric film 1 to produce an electrostatic attractive force between the polymeric film 1 and the cylindrical can 2, thereby keeping them in intimate contact with each other. Generally, a pierce-type electron gun which can scan a wide range is used as such an electron gun. After the thin film is formed on the polymeric film 1, the polymeric film 1 is still kept highly charged electrostatically. When the polymeric film 1 is kept charged, it is difficult to cause the polymeric film 1 to travel in a stable manner. For this reason, usually, the polymeric film 1 is subjected to a glow discharge treatment so as to eliminate the electrostatic charge from the polymeric film. This glow discharge treatment is effected by a glow discharge electrode 11 and gas which is introduced into a vacuum chamber.

When the thin film is to be formed by the above conventional method using the vacuum deposition apparatus, i.e. vacuum evaporation apparatus, of FIG. 5, there is encountered a problem in that where the cylindrical can is at elevated temperatures or the degassed polymeric film is used, wrinkles are liable to develop on the polymeric film during the step of applying the electrons to the polymeric film. Another problem is that the strength of bonding between the resultant thin film and the polymeric film is not adequate. Further, when the thin film is formed directly on the polymeric film, the characteristics or properties of the thin film, in some cases, have been found not satisfactory because of the influence of the polymeric film.

SUMMARY OF THE INVENTION

Therefore, it is an object of this invention to provide a method of producing a thin film which overcomes the above deficiencies of the prior art at least partly.

According to one aspect of the present invention, there is provided a method of producing a thin film which comprises the steps of:
 (a) moving a polymeric film or polymer film circumferentially on a peripheral surface of a cylindrical can;
 (b) applying ions and electrons from an ion gun to the polymeric film during the movement of the polymeric film;
 (c) subsequently applying electrons from an electron gun to the polymeric film; and
 (d) subsequently depositing the thin film on the polymeric film by vacuum evaporation.

According to a second aspect of the present invention, there is provided a method of depositing a thin film on a polymeric film while the polymeric film is traveling circumferentially on a peripheral surface of a cylindrical can, which comprises the steps of:
 (a) applying ions and electrons from a first ion gun to the polymeric film;
 (b) subsequently applying ions from a second ion gun to the polymeric film;
 (c) subsequently applying electrons from an electron gun to the polymeric film; and
 (d) subsequently depositing the thin film on the polymeric film by vacuum evaporation.

BRIEF DESCRIPTION OF THE DRAWINGS

FIGS. 2, 3 and 4 are views similar to FIG. 1, but showing modified vacuum deposition apparatuses for carrying out the method according to other embodiments of the invention, respectively;

DETAILED DESCRIPTION OF THE PREFERRED EMBODIMENTS OF THE INVENTION

The invention will now be described with reference to the attached drawings.

Figure 1:
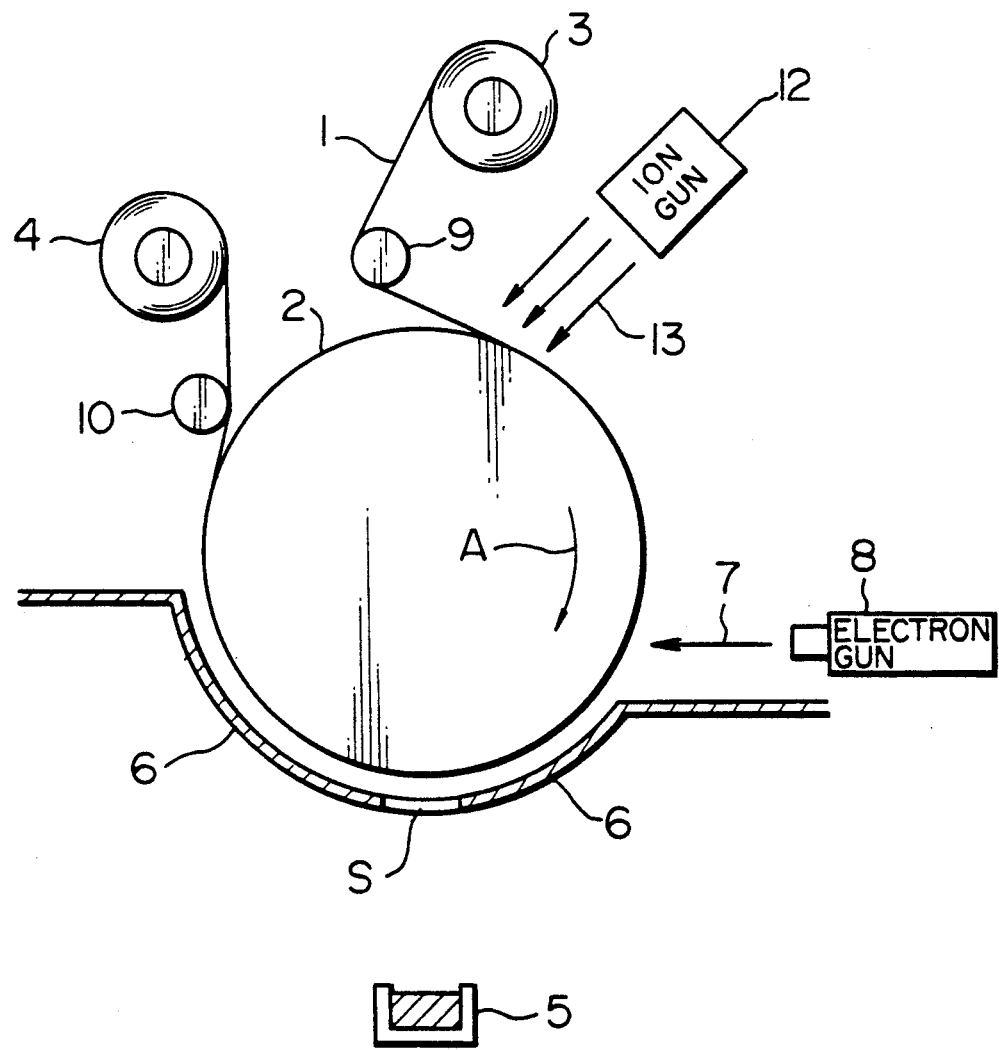
FIG. 1 is a schematic view of a vacuum deposition apparatus for performing a thin film-forming method according to an embodiment of the invention.
Figure 5:
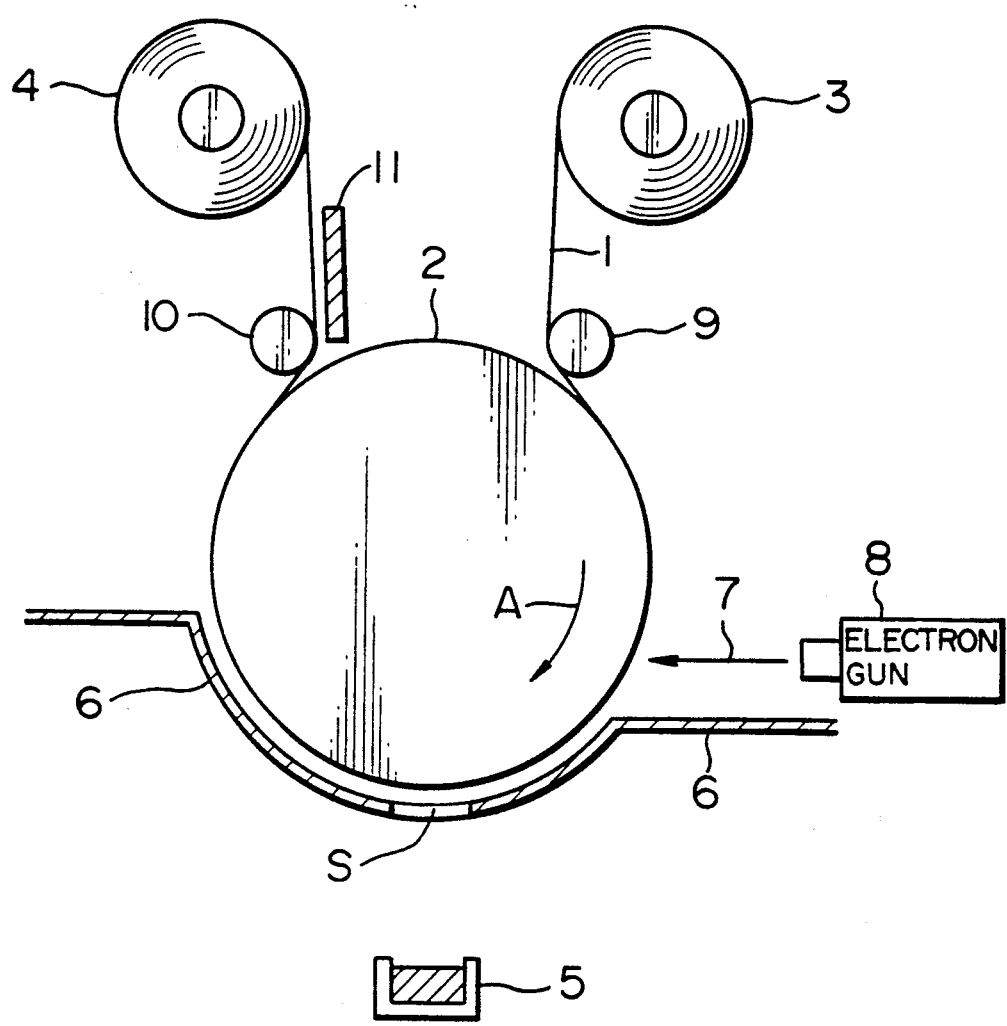
FIG. 5 is a schematic view of the prior art vacuum deposition apparatus.

A vacuum deposition apparatus shown in FIG. 1 is generally similar to that shown in FIG. 5 except that no glow discharge electrode 11 is employed and an ion gun 12 is provided.

Figure 6:
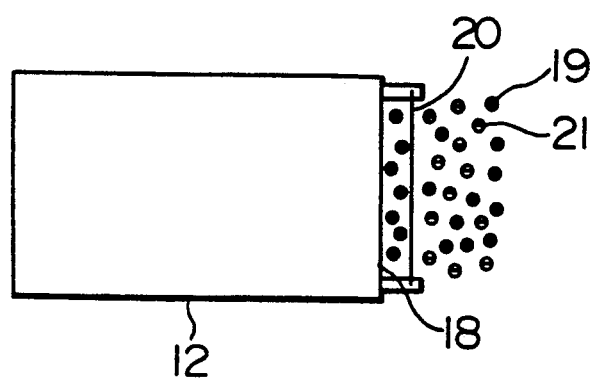
FIG. 6 is a schematic view showing the structure of an ion gun.

Ions and electrons 13 are emitted from the ion gun 12 toward a polymeric film 1 (on which a thin film has not yet been deposited) traveling circumferentially on an outer peripheral surface of a cylindrical can 2. Here, it is important that the ion gun 12 is so designed as to emit not only ions but also electrons. The structure of the ion gun 12 is schematically shown in FIG. 6. The ion gun 12 is similar to that commonly used in ion beam sputtering, ion milling, a pretreatment of a substrate, etc. Accelerated ions 19 of Ar, $N_2$, $H_2$, $O_2$, etc., come out of a grid 18 of the ion gun 12. Usually, Ar is used. Reference numeral 20 denotes a neutralizer, and when an electric current flows through the neutralizer 20, electrons 21 are generated. Reference numeral 13 in FIG. 1 designates a mixture of the ions 19 and the electrons 21. Although it is a common practice to increase the strength of bonding or adhesion between a thin film and a substrate by the application of ions, such substrate has been a thick and hard plate such as a glass plate and a metal plate. The polymeric film 1 used in the present invention as a substrate is thin and has a thickness of around 10 μm. When only ions are applied or irradiated to such thin polymeric film 1, the polymer film 1 becomes electrostatically charged due to the thus applied ions, and as a result it is difficult to cause the polymeric film 1 to travel on the outer peripheral surface of the cylindrical can 2 in a stable manner without developing any wrinkles on the polymeric film 1. Even if the ions are not applied to the polymeric film, the travel of the polymeric film is rendered unstable by its wrinkles produced by a small electrostatic charge produced by contact or friction. The polymeric film 1 is both positively and negatively charged, and the charged distribution thereof is not uniform. However, when the ions and electrons 13 are applied or irradiated from the ion gun 12 to the polymeric film 1, an electrostatic charge due to the irradiation, of course, will not be produced, i.e., because charges will be neutralized and in addition even if the polymeric film 1 has already been positively or negatively charged, such charge is substantially eliminated, and the polymer film is not charged by the simultaneous irradiation or application of ions and electrons. As a result, the part of polymeric film 1 in contact with the outer peripheral surface of 2 can will be able to easily run or travel on the outer peripheral surface of the cylindrical can 2 in a stable manner without having wrinkles produced therein. This enables the film 2 to slide over the surface of can 2 in a uniform and even manner in a wrinkle free state. In this method, even if the irradiated portion of polymeric film 1 in contact with the cylindrical can 2 has an elevated temperature relative to can 2 and is subjected to thermal expansion and deformation, the polymeric film 1 can easily slip or slide relative to the cylindrical can 2 because substantially no charge is present on the polymeric film 1, and therefore the polymeric film 1 can travel in a stable manner without developing wrinkles. Also, the polymeric film 1 which has been subjected to a sufficient degassing treatment can easily slip or slide because substantially no charge is present thereon, and therefore the polymeric film 1 can travel in a stable manner without developing wrinkles. The polymeric film 1, which has not been subjected to a degassing treatment, emits gas (mostly water) as it travels within the vacuum deposition apparatus, and the thus emitted gas forms a layer between the polymeric film 1 and the outer peripheral surface of the cylindrical can 2. Therefore, the polymeric film 1 can relatively easily move on the outer peripheral surface of the cylindrical can 2. However, when the gas was emitted from the polymeric film 1 during the vacuum deposition, the characteristics of the resultant thin film deposited on the polymeric film 1 were degraded or adversely affected. On the other hand, when the polymeric film 1 has been subjected to a degassing treatment, nothing is present between the polymeric film 1 and the cylindrical can 2, and besides the polymeric film 1 hardly contains water and therefore is liable to be electrostatically charged. In this case, it was difficult to cause the polymeric film 1 to travel in a stable manner without any wrinkles being produced.

Figure 2:
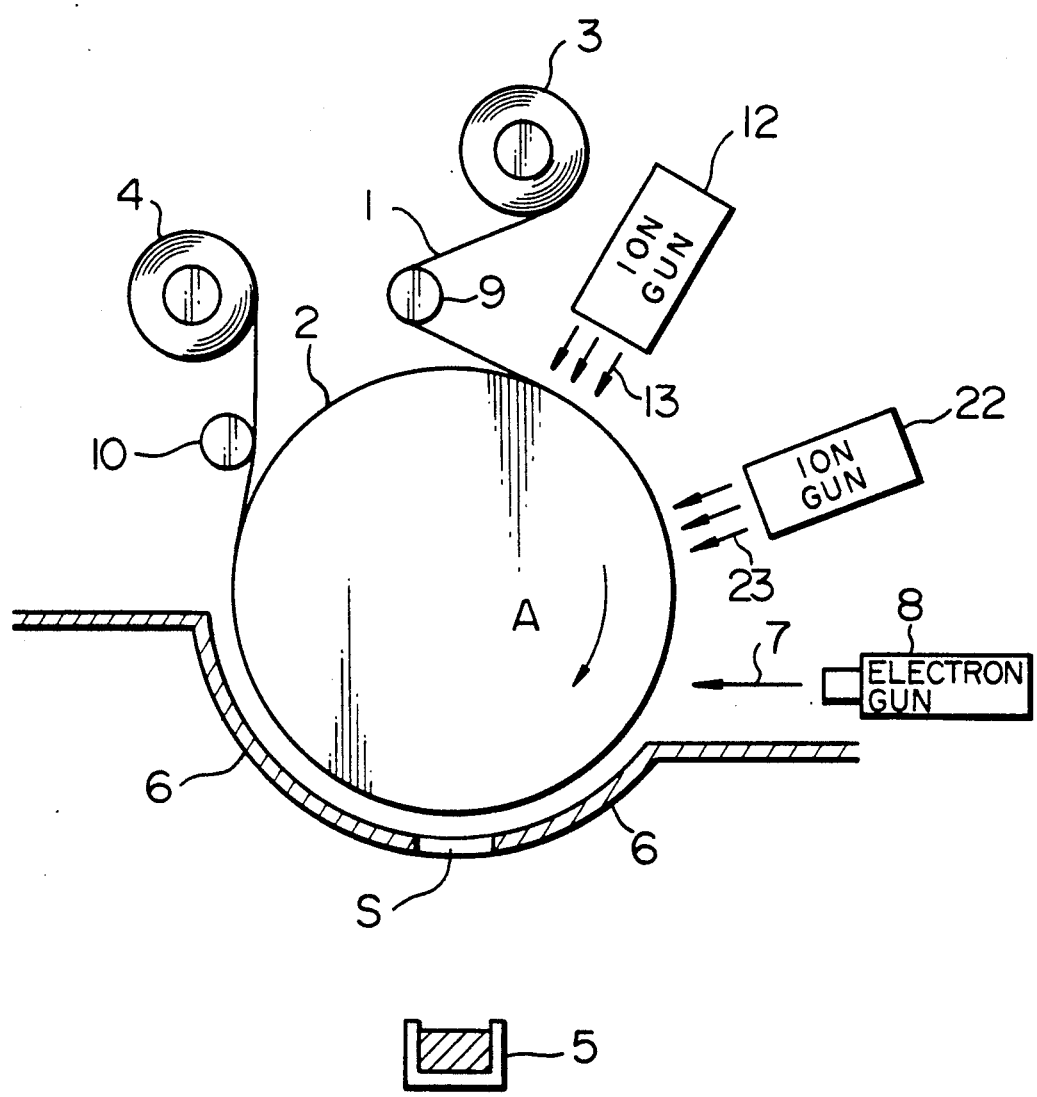

FIG. 2 schematically shows an internal structure of a modified vacuum deposition apparatus for carrying out the method according to an embodiment of the invention for positively changing the properties of the surface of the polymeric film 1. The apparatus shown in FIG. 2 is generally similar to the vacuum deposition apparatus of FIG. 1 except that in addition to the first ion gun 12, a second ion gun 22 is provided. The second ion gun 22 is provided to change the surface properties of the polymeric film 1, and this second ion gun 22 differs from the first ion gun 12 in the manner of use or operation. More specifically, the second ion gun 22 is not provided with a neutralizer, and therefore emits only ions. In addition, the second ion gun 22 operates at a higher ion-accelerating voltage than that of the first ion gun 12. With this construction, first, electrostatic charges on the polymeric film 1 are cancelled by the ions and electrons 13 emitted from the first ion guns 12, so that the polymeric film 1 can be disposed in contact with the outer periphery of the cylindrical can 2 without producing wrinkles. Then, the polymeric film 1 is electrostatically charged by ions 23 of high energy emitted from the second ion gun 22, so that the polymeric film 1 is kept in intimate contact with the outer periphery of the cylindrical can 2. At the same time, the surface properties of the polymeric film 1 are changed, so that the characteristics and bonding or adhesion strength of the thin film are improved. In this case, it is not possible to sufficiently adequately change the surface properties of the polymeric film 1 only by the first ion gun 12 without the use of the second ion gun 22. The reason for this will now be described. The second ion gun 22 electrostatically charges the polymeric film 1 to keep the same in intimate contact with the cylindrical can 2. However, the first ion gun 12 eliminates or cancels the electrostatic charge on the polymeric film 1 so that the polymeric film 1 does not stick to the cylindrical can 2. If the energies of the ions emitted from the first ion gun 12 are high, the energies of the ions are not transferred to the cylindrical can 2, so that the polymeric film 1 is subjected to thermal damage.

When electrons are to be applied from the electron gun 8 to the polymeric film 1, it is necessary to accelerate these electrons. Although the required accelerating voltage varies slightly depending on the kind of the polymeric film 1 and the vacuum deposition conditions, it will generally suffice that this voltage is not less than 1 kV, and this voltage can be determined according to the particular situation encountered. If the electrons are emitted under a low accelerating voltage, these electrons fail to penetrate deeply into the polymeric film 1, and are separated therefrom, for example, upon the deposition of the metal film. Under such circumstances, the electrostatic attractive force is lost, so that the heat received by the polymeric film 1 can not dissipate to the cylindrical can 2. Usually, the electron gun 8 used here is of the pierce type. The pierce-type electron gun 8 has a wide scanning range, and is suited for applying electrons to the web-like polymeric film 1 of a large width. In addition, this type of electron gun is suitable because its accelerating voltage is generally not less than 30 kV.

In the case where the width of the polymeric film 1 is small or where the pierce-type electron gun is not installed, an electron gun of a smaller size may be used. Electrons are applied to the polymeric film 1 so as to keep it in intimate contact with the cylindrical can 2. The advantage of this method is that it can be used even if the polymeric film 1 has a defect such as a pinhole. The disadvantage of this method is that if because of the presence of a wrinkle or a foreign matter, a gap is partially formed between a portion of the polymeric film 1 and the cylindrical can 2 after the application of the electrons, the very portion is subjected to thermal decomposition during the vacuum deposition. When the polymeric film 1 is thermally decomposed, a decomposition gas is produced, so that the gas between the polymeric film 1 and the cylindrical can 2 is enlarged to a considerable extent. Therefore, when the polymeric film 1 is to be kept in intimate contact with the cylindrical can 2 by the application of the electrons, it is particularly necessary that the polymeric film have no wrinkles.

Figure 3:
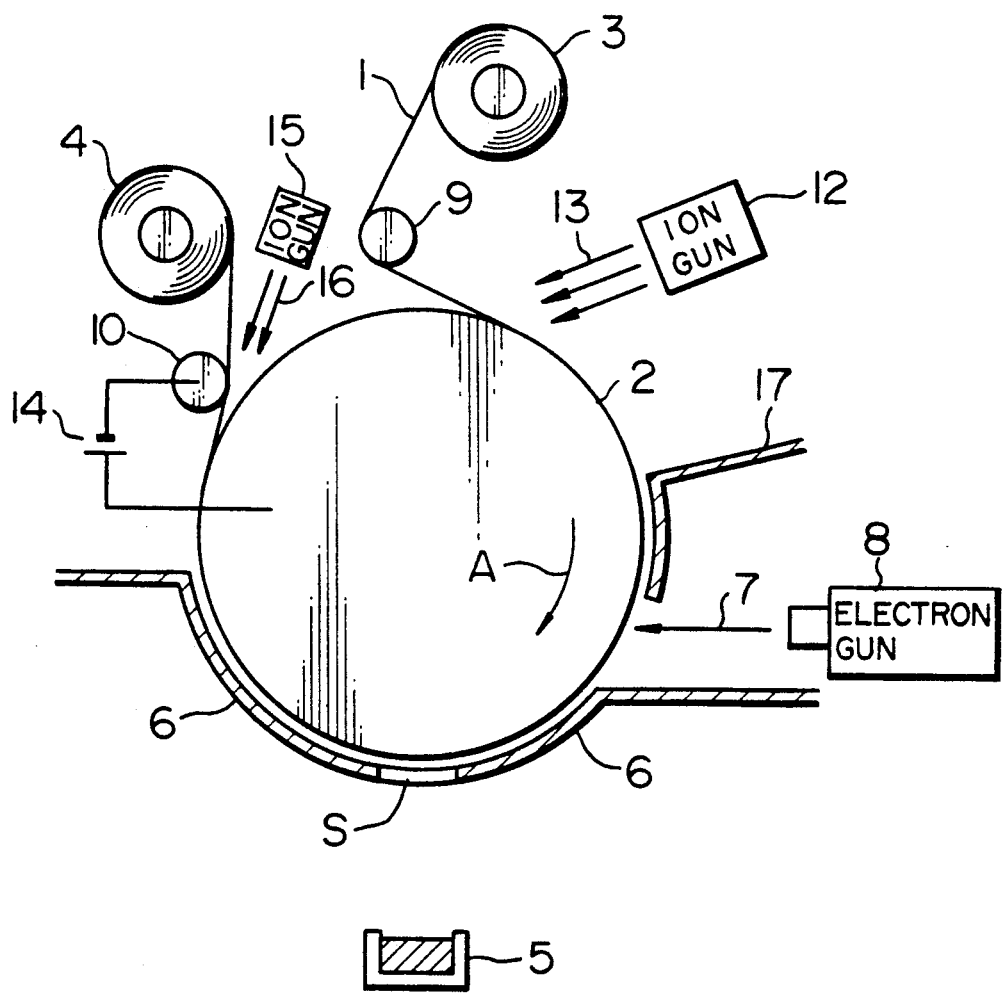

An auxiliary means effective for keeping the polymeric film in intimate contact with the outer peripheral surface of the cylindrical can will now be described. In the case where the thin film to be formed is electrically conductive, an electric potential difference is applied between the thin film and the cylindrical can. As shown in FIGS. 3 and 4, a voltage source 14 is connected between the free roller 10 and the cylindrical can 2, to apply 1 potential difference between the deposited thin film and the cylindrical can 2 through the free roller 10. An electrostatic attractive force is produced by this potential difference, and immediately when the thin film is formed or deposited on the polymeric film 1, the film 1 is brought into intimate contact with the cylindrical can 2. The advantage of this method is that even if part of the polymeric film 1 is spaced apart from the outer peripheral surface of the cylindrical can 2 due to a foreign matter of the like, an extensive thermal decomposition of the polymeric film 1 can be avoided. The disadvantage of this method is that if the polymeric film 1 has a defect such as a pinhole, this method is not effective. Particularly when the applied voltage is high, the damage is heavy although the effects of keeping the polymeric film in intimate contact with the cylindrical can are excellent. A combined use of the application of electrons and the application of the potential difference is very effective, since such combined use enables the applied voltage to be low.

The polymeric film 1, after the vacuum deposition, is maintained in an electrostatically charged condition since the electrons applied to and penetrating into the polymeric film remain. When the polymeric film 1 is electrostatically charged, the movement of the polymeric film 1 is unstable, and wrinkles are liable to develop, as described above before. In addition, when the polymeric film 1 is separated from the outer peripheral surface of the cylindrical can 2, there is a possibility that a spark discharge may be produced so that the polymeric film 1 may be damaged. This phenomenon is conspicuous when vacuum-depositing a thin film on the polymeric film 1 of the type having a high electric resistivity. In such a case, it is necessary to eliminate the electrostatic charge from the polymeric film 1. A conventional method of eliminating the electrostatic charge was to introduce gas into the vacuum deposition apparatus to effect a glow discharge treatment. Although the electrostatic charge is eliminated from the polymeric film by this method, the influence of the introduction of gas on the thin film to be formed could not be avoided. In the present invention, this problem is solved by applying ions and electrons 16 from an ion gun 15 to the polymeric film 1 after the thin film is formed, as shown in FIGS. 3 and 4. The application of the ions and electrons 16 to either surface (i.e., the surface having the thin film formed thereon or the reverse surface) of the polymeric film 1 is effective. However, in the case where the thin film is metallic, it is more effective to apply the ions and electrons 16 to the reverse surface of the polymeric film 1, i.e. on a side of the film 1 where the metallic film is not deposited, in the vicinity of a portion of the film 1 where the polymeric film 1 is separated from the outer peripheral surface of the cylindrical can 2. Here, it is not desirable that the thus applied ions and electrons 16 reach the film-forming portion, i.e. a portion of the film 1 where the thin film is deposited through the opening S, in a large amount. This is because, the required electrostatic attractive force at the film-forming portion is lost, and the result is that it is difficult to carry out the vacuum deposition in a stable manner. Therefore, it is necessary to take the direction of the ion gun 15 and the provision of a shield plate into consideration so that the ions and electrons will not reach the film-forming portion in a large amount.

In FIG. 1, at the first step, the ions and electrons 13 are applied from the ion gun 12 to the polymeric film 1. It is preferred that a partition wall be provided so as to prevent the first step from interfering with the subsequent second step of applying electrons from the electron gun 8. Particularly in a case where the two positions at which the first and second steps are respectively carried out can not be spaced a sufficient distance from each other because of the limited size of the apparatus, such a partition wall needs to be provided. Namely, the ions and electrons 13 emitted from the ion gun 12 are required to be in a controlled, balanced condition. If other electrons intermingle with the ions and electrons 13, the balance is destroyed and control is difficult. Therefore, as shown in FIG. 3, it is effective to provide a partition wall 17 (which serves to prevent the intermingling of the electrons) between the two positions at which the step of applying the ions and electrons 13 by the ion gun 12 and the step of applying the electrons by the electron gun 8 are carried out, respectively. This is also the case with FIG. 2. More specifically, in this case, the ions and electrons 13 are applied to the polymeric film 1 from the first ion gun 12 at the first step, and the ions 23 are applied to the polymeric film 1 from the second ion gun 22 at the second step, and the electrons are applied to the polymeric film 1 from the electron gun 8 at the third step. In order to prevent these three steps from interfering with one another, it is preferred to provide partition walls. Particularly in a case where the three positions at which the three steps are respectively carried out can not be spaced a sufficient distance from one another because of the limited size of the apparatus, such partition walls are needed. As shown in FIG. 4, a partition wall 17 is provided between the two positions at which the step of applying the ions and electrons 13 by the first ion gun 12 and the step of applying the ions 23 by the second ion gun 22 are carried out, respectively. Also, another partition wall 17 is provided between the two positions at which the step of applying the electron beam 7 by the electron gun 8 are carried out, respectively.

The invention will now be illustrated by way of the following Examples.

EXAMPLE 1

A metallic thin film of Co-Cr alloy was formed using the vacuum deposition apparatus shown in FIG. 3. The Co-Cr film has now been noteworthy because of its use as a high-density magnetic recording medium.

As the polymeric film 1, there was used a polyimide film which was subjected to a degassing treatment and had a width of 50 cm and a thickness of 7 μm. The polyimide film 1 was supplied from the supply roll 3, and was cause to travel on the outer peripheral surface of the cylindrical can 2 in the direction of arrow A at a speed of 20 m/min., and was taken up by the take-up roll 4. The temperature of the cylindrical can 2 was 250° C. The ions and electrons 13 were applied to the polyimide film from the ion gun 12. The ion accelerating voltage was 500 V, and the current density of the ions was 0.1 mA/cm$^2$, and the current density of the electrons was the same as that of the ions, that is, 0.1 mA/cm$^2$. Argon gas (Ar) was used as the gas to be ionized. The rate of introduction of the argon gas was 20 cc/min. A pierce-type electron gun whose accelerating voltage was 30 kV was used as the electron gun 8 for keeping the polyimide film in intimate contact with the cylindrical can 2. The emission current was 100 mA, and the emitted electron beam was scanned at 600 Hz in a widthwise direction of the polyimide film. An electron-beam-evaporation source was used as the evaporation source 5. As the auxiliary means for keeping the polyimide film in intimate contact with the cylindrical can 2, a dc voltage of 100 V was applied from the voltage source 14 between the Co-Cr film and the cylindrical can 2. In order to eliminate the electrostatic charge from the polyimide film, the ions and electrons 16 were applied from the ion gun 15 to the reverse surface of the polyimide film. The ion accelerating voltage was 500 V, and the current density of the ions was 0.1 mA/cm$^2$, and the current density of the electrons was the same as that of the ions, that is, 0.1 mA/cm$^2$. Argon gas (Ar) was used as the gas to be ionized. The rate of introduction of the argon gas was 10 cc/min. With this method, the Co-Cr film having a thickness of 0.2 μm was formed on the polyimide film. As a result, a long Co-Cr film, having no wrinkles and having a high strength of bonding or adhesion to the polyimide film, could be formed in a stable manner.

EXAMPLE 2

A metallic thin film of Co-Cr alloy was formed using the vacuum deposition apparatus shown in FIG. 4.

As the polymeric film 1, there was used a polyimide film which was subjected to a degassing treatment and had a width of 50 cm and a thickness of 7 μm. The polyimide film was supplied from the supply roll 3, and was caused to travel on the outer peripheral surface of the cylindrical can 2 in the direction of arrow A at a speed of 100 m/min., and was taken up by the take-up roll 4. The ions and electrons 13 were applied to the polyimide film from the first ion gun 12, and the ions 23 were applied to the polyimide film from the second ion gun 22. With respect to the first ion gun 12, the ion accelerating voltage was 500 V, and the current density of the ions was 1 mA/cm$^2$, while the current density of the electrons was the same as that of the ions, that is, 1 mA/cm$^2$. With respect to the second ion gun 22, the ion accelerating voltage was 1000 V (in the case of sample C) and 1500 V (in the case of sample D), and the current density of the ions was 1 mA/cm$^2$. For comparison purposes, comparative thin film A and B were also prepared. More specifically, in the case of depositing the comparative thin film B, the first ion gun 12 was used under the same conditions as in the thin films C and D, and the second ion gun 22 was not used. In case of depositing the comparative thin film A, the first and second ion guns 12 and 22 were not used. Except for these, the comparative thin films A and B were prepared under the same conditions as those of the thin films C and D of the present invention. Argon gas (Ar) was used as the gas to be ionized. The rate of introduction of the argon gas was 80 cc/min. A pierce-type electron gun whose accelerating voltage was 30 kV was used as the electron gun 8 for keeping the polyimide film in intimate contact with the cylindrical can 2. The emission current was 1 A, and the emitted electron beam was scanned at 600 Hz in a widthwise direction of the polyimide film. An electron-beam-evaporation source was used as the evaporation source 5. As the auxiliary means for keeping the polyimide film in intimate contact with the cylindrical can 2, a dc voltage of 100 V was applied from the voltage source 14 between the Co-Cr film and the cylindrical can 2. In order to eliminate the electrostatic charge from the polyimide film, the ions and electrons 16 were applied from the ion gun 15 to the reverse surface of the polyimide film. The ion accelerating voltage was 500 V, and the current density of the ions was 0.1 mA/cm$^2$, and the current density of the electrons was the same as that of the ions, that is, 0.1 mA/cm$^2$. Argon gas (Ar) was used as the gas to be ionized. The rate of introduction of the argon gas was 50 cc/min. With this method, a Co-Cr alloy film having a thickness of 0.2 μm was formed on the polyimide film. The properties of the thin films A to D were evaluated by a vibrating sample magnetometer.

The results are shown in the Table set forth below. In the comparative thin film A to which the ions were not applied from the first and second ion guns 12 and 22, the anisotropic magnetic field Hk was about 2.5 kOe, and the coercive force Hc in a direction perpendicular to the plane of the thin film was about 600 Oe. On the other hand, according to an embodiment of the method of the present invention, in the case of the thin film D (with respect to which the accelerating voltage of the second ion gun 22 was 1500 V), the anisotropic magnetic field Hk was about 5 KOe, and the coercive force Hc was about 1100 Oe. Thus, both magnetic properties are improved greatly. Without the application of the ions, it has been difficult to produce a long thin film having no wrinkles, and besides the strength of bonding of the thus formed thin film to the polymeric film have been found not satisfactory. However, according to embodiments of the method of the present invention, a long Co-Cr film, having no wrinkles and having a high strength of bonding could be formed in a stable manner.

TABLE

| Sample | Hk (kOe) | Hc (Oe) |
| --- | --- | --- |
| A | about 2.5 | about 600 |
| B | about 3 | about 800 |
| C | about 5 | about 1000 |
| D | about 5 | about 1100 |

In the above two Examples, although the Co-Cr film was formed on the polyimide film, any suitable polymeric film other than a polyimide film may be used, and the advantageous effects of the present invention can be also achieved with respect to any suitable thin film other than the Co-Cr film.

We claim:

1. A method of continuously producing a thin film on a polymer film by vacuum evaporation while moving said polymer film circumferentially along an outer peripheral surface of a cylindrical can from a supply location of said polymer film relative to said cylindrical can to a take-up location of said polymer film relative to said cylindrical can, said method comprising:

(a) neutralizing said polymer film by applying accelerated ions from an ion gun and unaccelerated electrons onto a part of said polymer film while it is moving through a position near said supply location at which said polymer film begins to make contact with said outer peripheral surface of said cylindrical can;

(b) at a location relative to said cylindrical can between said position at which said ions and electrons are applied to said polymer film and said take-up location, applying electrons from an electron gun onto said polymer film while it is traveling on said outer peripheral surface of said cylindrical can; and (c) at a location relative to said cylindrical can between said location at which said electrons are applied onto said polymer film from said electron gun and said take-up location, continuously depositing the thin film by vacuum evaporation on said polymer film while it is traveling on said outer peripheral surface of said cylindrical can.

2. A method according to claim 1, in which said thin film to be deposited on said polymeric film is electrically conductive, said method further comprising applying an electric potential difference between said electrically conductive thin film and said cylindrical can.

3. A method according to claim 1, further comprising the step of applying ions and electrons from an ion gun to said polymer film after said thin film is deposited on said polymer film.

4. A method according to claim 1, in which a partition wall is provided between two positions at which said step (b) and said step (c) are carried out, respectively.

5. A method according to claim 1, further comprising the step of degassing said polymer film as a pretreatment.

6. A method of continuously producing a thin film on a polymer film by vacuum evaporation while and polymer film is moving circumferentially along an outer peripheral surface of a cylindrical can from a supply location of said polymer film relative to said cylindrical can to a takeup location of said polymer film relative to said cylindrical can, said method comprising the steps of:

(a) neutralizing said polymer film by applying accelerated ions from a first ion gun and unaccelerated electrons onto a part of said polymer film while it is moving through a position near said supply location at which said polymer film begins to make contact with said outer peripheral surface of said cylindrical can;

(b) at a location relative to said cylindrical can between said position at which said ions and electrons are applied to said polymer film and said take-up location, applying ions from a second ion gun onto said polymer film while it is traveling on said outer peripheral surface of said cylindrical can;

(c) at a location relative to said cylindrical can between said location at which said ions are applied by said second ion gun onto said polymer film and said take-up location, applying electrons from an electron gun onto said polymer film while it is traveling on said outer peripheral surface of said cylindrical can; and (d) at a location relative to said cylindrical can between said location at which said electrons are applied onto said polymer film from said electron gun and said take-up location, continuously depositing the thin film by vacuum evaporation on said polymer film while it is traveling on said outer peripheral surface of said cylindrical can.

7. A method according to claim 6, in which an ion accelerating voltage of said second ion gun is higher than that of said first ion gun.

8. A method according to claim 6, in which said thin film to be deposited on said polymer film is electrically conductive, said method further comprising applying an electric potential difference between said electrically conductive thin film and said cylindrical can.

9. A method according to claim 6, further comprising the step of applying ions and electrons from an ion gun to said polymer film after said thin film is deposited on said polymer film.

10. A method according to claim 6, further comprising the step of providing a partition wall between two positions at which said step (a) and said step (b) are carried out, respectively.

11. A method according to claim 6, further comprising the step of providing a partition wall between two positions at which said step (b) and said step (c) are carried out, respectively.

12. A method according to claim 6, further comprising step of providing a first partition wall is provided between two positions at which said step (a) and said step (b) are carried out, respectively, and the step of providing a second partition wall between two positions at which said step (b) and said step (c) are carried out, respectively.

13. A method according to claim 6, further comprising the step of degassing said polymer film as a pretreatment.

* * * * *